United States Patent
Lin et al.

(10) Patent No.: US 9,123,438 B2
(45) Date of Patent: Sep. 1, 2015

(54) CONFIGURABLE DELAY CIRCUIT AND METHOD OF CLOCK BUFFERING

(71) Applicant: Nvidia Corporation, Santa Clara, CA (US)

(72) Inventors: Hwong-Kwo Lin, Santa Clara, CA (US); Lei Wang, Santa Clara, CA (US); Spencer Gold, Westford, MA (US); Zhenye Jiang, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 64 days.

(21) Appl. No.: 14/054,313

(22) Filed: Oct. 15, 2013

(65) Prior Publication Data

US 2015/0103584 A1    Apr. 16, 2015

(51) Int. Cl.
G11C 7/22       (2006.01)
G11C 11/419    (2006.01)
G11C 11/4076  (2006.01)

(52) U.S. Cl.
CPC .............. *G11C 11/419* (2013.01); *G11C 7/22* (2013.01); *G11C 7/222* (2013.01); *G11C 11/4076* (2013.01)

(58) Field of Classification Search
CPC ........ G11C 16/24; G11C 16/10; G11C 16/26; G11C 16/3418; G11C 16/0483
USPC ........................ 365/194, 49.1, 189.05, 230.08
See application file for complete search history.

(56) References Cited

U.S. PATENT DOCUMENTS 6,646,899 B2 * 11/2003 Yiu et al. ...................... 365/49.1

* cited by examiner

*Primary Examiner* — Jason Lappas

(57) ABSTRACT

A configurable delay circuit and a method of clock buffering. One embodiment of the configurable delay circuit includes: (1) a first delay stage electrically couplable in series to a second delay stage, the first delay stage and the second delay stage each having an input port electrically coupled to a signal source, and (2) a delay path select circuit electrically coupled between the first delay stage and the second delay stage, and operable to select between a delay path including the first delay stage and another delay path including the first delay stage and the second delay stage.

14 Claims, 4 Drawing Sheets

CONFIGURABLE DELAY CIRCUIT AND METHOD OF CLOCK BUFFERING

TECHNICAL FIELD

This application is directed, in general, to static random access memory (SRAM) and, more specifically, to signal buffering.

BACKGROUND

In very large scale integration (VLSI) circuit design, one challenge is to control the arrival times of critical signals according to certain arrival time relationship constraints. For example, in SRAM, a pre-charge signal should be turned off before turning on a write enable signal. As technology improves and VLSI designs advance, the arrival-time issue becomes even more challenging, due to increasing circuit nonlinearities and tighter timing constraints. Additionally, large scaled manufacturing introduces variations across process, voltage, and temperature (PVT) corners. These variations impact critical signal timing and skew "worst case" timing margins.

Another complicating factor is the increasing prevalence of multi-power-domain designs, which are often found in mobile computing. Single-power-domain designs tend to consume more power than multi-power-domain equivalents, making the multi-power-domain circuits more amenable to mobile applications. However, lower voltage levels are typically slower than higher voltage levels. For example, in SRAM, where logic levels are lower than cell voltages, delay chains for the logic level signals, such as pre-charge, must be shorter than delay chains for the cell voltage signals, such as the wordline.

One approach to managing arrival times of critical signals is to introduce a fixed margin, or delay, that accommodates the worst case latency in a particular signal path. Fixed margins tend to be overly conservative over a majority of the PVT domain and ultimately introduce performance penalties on the system. Alternatively, multiple delay paths can be multiplexed such that different delay paths can be utilized under different scenarios. This approach reduces system performance penalties, however, it also consumes more area.

SUMMARY

One aspect provides a configurable delay circuit. In one embodiment, the configurable delay circuit includes: (1) a first delay stage electrically couplable in series to a second delay stage, the first delay stage and the second delay stage each having an input port electrically coupled to a signal source, and (2) a delay path select circuit electrically coupled between the first delay stage and the second delay stage, and operable to select between a delay path including the first delay stage and another delay path including the first delay stage and the second delay stage.

Another aspect provides a method of clock buffering. In one embodiment, the method includes: (1) selecting a delay path having a configurable delay formed by a plurality of transistor stacks serially electrically couplable by respective delay path select circuits, and (2) employing the respective delay path select circuits in electrically coupling the plurality to a base delay path, thereby activating the delay path and allowing a clock signal to propagate therein.

Yet another aspect provides an SRAM clock circuit. In one embodiment, the SRAM clock circuit includes: (1) a plurality of transistor stacks optionally serially electrically couplable to form a configurable delay path through which a clock signal is buffered, and (2) a delay path select circuit respectively electrically coupled between pairs of the plurality of transistor stacks and operable to selectively electrically couple the plurality of transistor stacks to a base delay path, thereby activating the configurable delay path based on a desired delay.

Yet another aspect provides an SRAM. In one embodiment, the SRAM includes: (1) a plurality of SRAM cells and a plurality of control signals controlling access thereto, (2) a signal source configured to generate a clock signal, (3) a plurality of transistor stacks optionally serially electrically couplable to form a configurable delay path through which the clock signal is buffered, (4) a delay path select circuit respectively electrically coupled between pairs of the plurality of transistor stacks and operable to selectively electrically couple the plurality of transistor stacks to a base delay path, thereby activating the configurable delay path based on a desired delay, and (5) a memory controller configured to receive a buffered clock signal and operable to generate the control signals based thereon.

BRIEF DESCRIPTION

Reference is now made to the following descriptions taken in conjunction with the accompanying drawings, in which.

DETAILED DESCRIPTION

Figure 1:
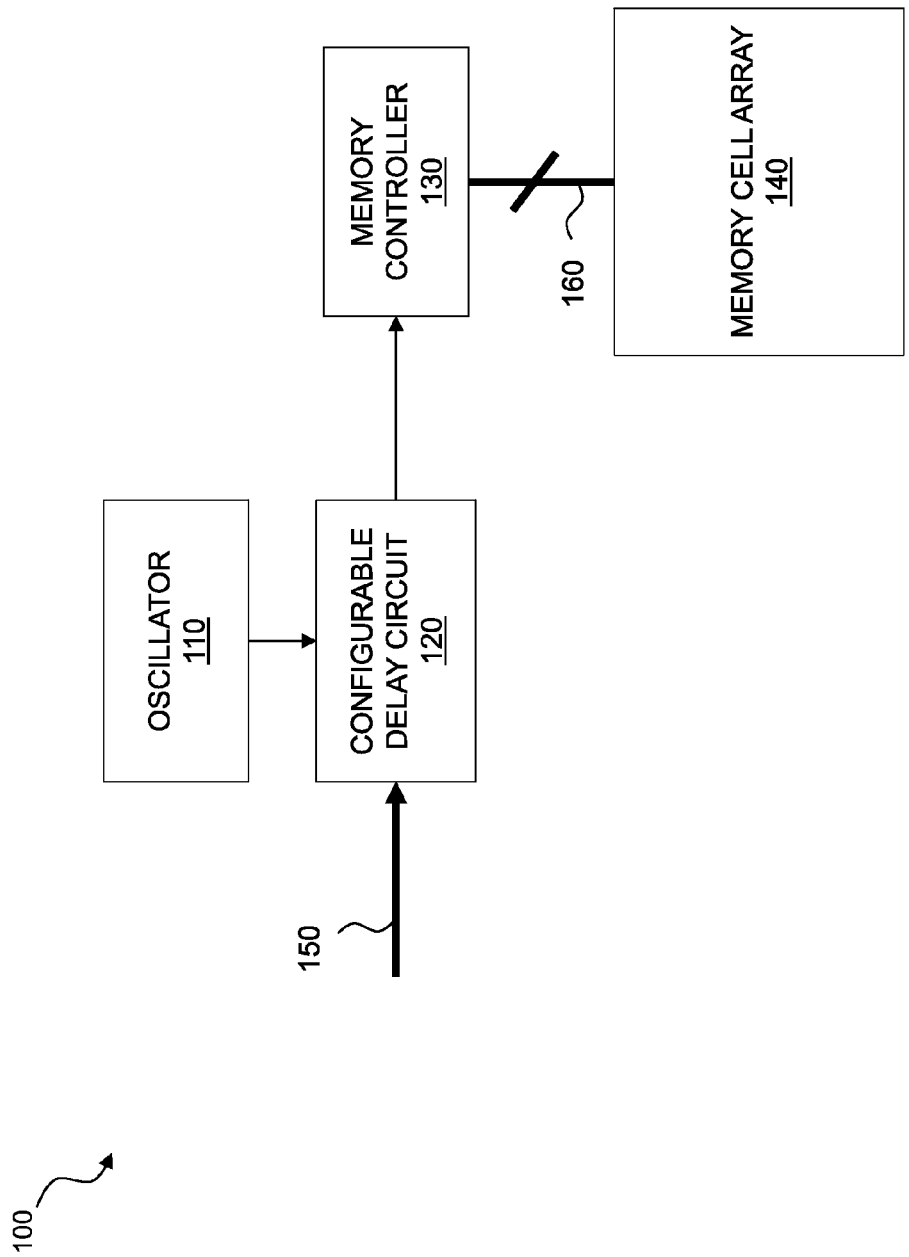
FIG. 1 is a block diagram of one embodiment of an SRAM having a configurable delay circuit.

An SRAM generally includes multiple memory cells arranged in an array. The rows and columns of the array are individually addressable, therefore making each memory cell individually addressable. Access to the memory cell is controlled by control signals. Two control signals, a wordline and a bitline, form a two-dimensional memory address that allows addressing of the memory cell. A memory cell can generally be written to and read from. The particular action taken is typically dictated by two other control signals, read enable and write enable. In certain SRAM embodiments, read enable and write enable can be combined into a single enable signal. Additionally, certain SRAM embodiments have a control signal known as a pre-charge signal. The pre-charge signal produces a voltage bias that better enables decision logic for reading and writing to the memory cells.

The generation and application of the control signals is sensitive to timing variations. Certain control signals must arrive at certain times and in certain sequences for a particular action, which is typically either a read or write. SRAM control signals are typically generated based on a clock signal. An SRAM design typically incorporates various buffers, or delay paths, through which the clock signal is to pass, each providing time margin between control signals. Buffered clock signals are then distributed throughout the SRAM circuits.

It is realized herein that a configurable delay circuit, sometimes referred to as a "configurable delay buffer," can be constructed without requiring excessive area and without introducing performance penalties. It is realized herein that the building blocks of the configurable delay circuit are transistor stacks that can be selectively electrically coupled to the base delay path by a delay path select circuit. The base delay path is effectively the shortest, or fastest delay path. As transistor stacks are selectively electrically coupled, it is realized herein that, the delay path lengthens, providing a longer buffer. It is also realized herein that the delay path select circuit allows the formation of a configurable delay path by either electrically coupling an additional transistor stack or bypassing the additional transistor stack and electrically coupling a voltage source.

It is further realized herein that multiple additional transistor stacks can be optionally electrically coupled to the base delay path independently. This provides flexibility beyond the base delay path and a single, longer delay path. In these embodiments, the delay path select circuit employs multiple select signals to activate and deactivate the various transistor stacks.

Transistor stacks can be formed by a plurality of positive or negative field effect transistors (PFETs or NFETS). The plurality are serially assembled source-to-drain, herein referred to as serially electrically coupled.

Electrically coupled is herein defined as connecting two electrical components, groups of components, or otherwise conductive elements, such that an electrical signal may pass from one to the other. For example, an electrical contact on a memory chip is electrically coupled to an electrical contact on a processor by a copper trace or wire between the two. In another example, input terminals on a transformer are electrically coupled to output terminals on the transformer, although the electrical coupling is inductive in nature.

FIG. 1 is a block diagram of one embodiment of an SRAM 100 within which the configurable delay circuit or method of clock buffering introduced herein may be embodied or carried out. SRAM 100 includes an oscillator 110, a configurable delay circuit 120, a memory controller 130, and a memory cell array 140.

Memory cell array 140 contains a plurality of SRAM cells arranged in rows and columns. Access to the plurality of SRAM cells is controlled by control signals 160. Control signals 160 are generated by memory controller 130 in a specific sequence and arriving at memory cell array 140 within certain timing constraints to allow reads and writes. In various embodiments, control signals 160 include wordline, bitline, write enable, read enable, and others.

To meet various timing constraints, control signals 160 are generated by memory controller 130 based on a buffered clock signal generated by configurable delay circuit 120. Configurable delay circuit 120 receives a clock signal generated by oscillator 110 and applies a configurable delay. The length of the configurable delay is a function of the devices in the configurable delay circuit 120. Configurable delay circuit 120 includes optionally electrically couplable transistor stacks that add to the cumulative delay path. Precisely which devices or groups of devices are in the delay path is controlled by select signals 150. In certain embodiments, a single select signal can suffice to select between a base delay path and a longer delay path. In alternate embodiments, multiple select signals are employed to select among at least two delay paths, typically of varying lengths. Select signals 150 allow for dynamic control of configurable delay circuit 120, as opposed to a static solution, i.e., hardwired.

Figure 2:
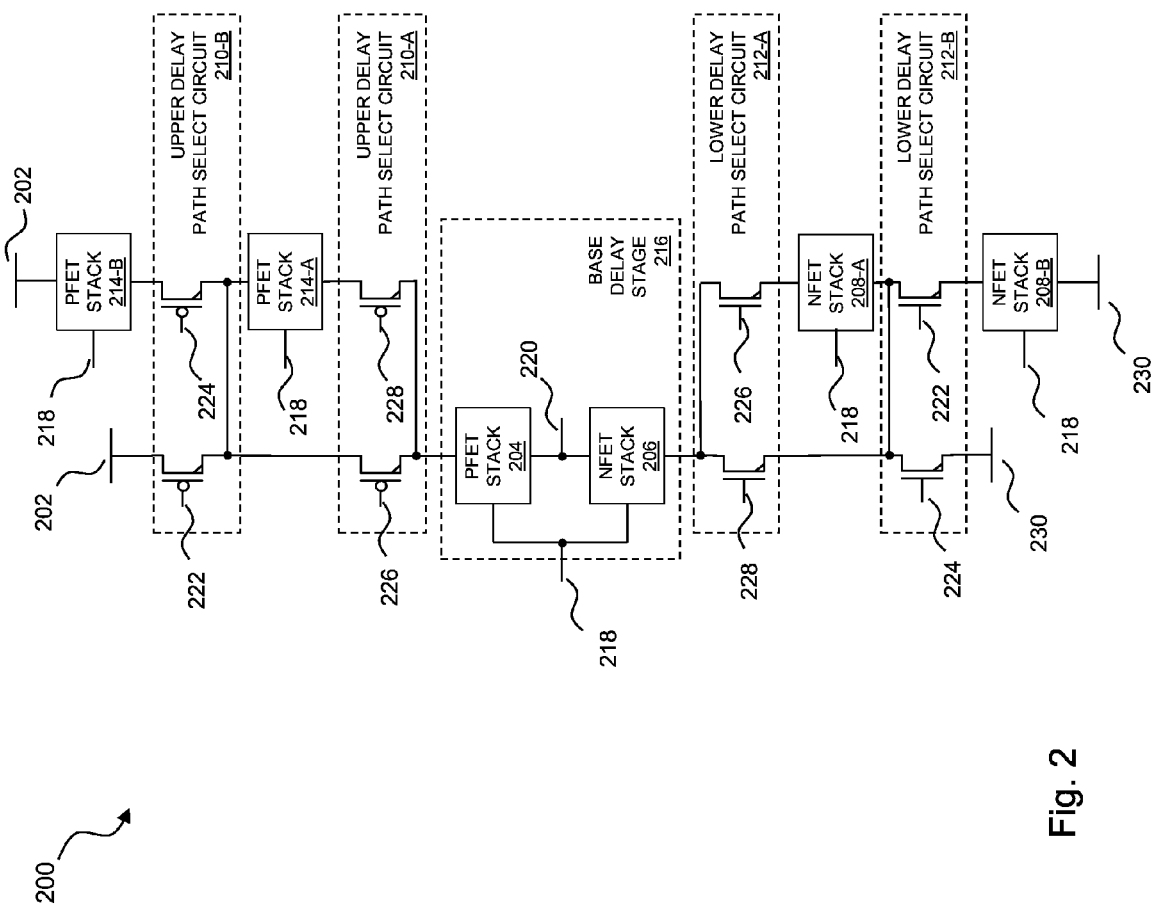
FIG. 2 is a functional block diagram of one embodiment of a configurable delay circuit.

FIG. 2 is a block diagram of one embodiment of a configurable delay circuit 200. Configurable delay circuit 200 includes a base delay stage 216, PFET stack 214-A and PFET stack 214-B, NFET stack 208-A and NFET stack 208-B, and multiple delay path select circuits: upper delay path select circuit 210-A, upper delay path select circuit 210-B, lower delay path select circuit 212-A, and lower delay path select circuit 112-B. Additionally, configurable delay circuit 200 is powered by a voltage source 202 with a reference, or ground 230, and has an input port 218 and an output port 220.

Input port 218 is electrically couplable to a signal source. For example, in certain embodiments input port 218 is electrically coupled to an oscillator, or clock device, that generates a clock signal to be buffered. The buffered signal is then available on output port 220. Output port 220 is electrically couplable to a circuit capable of using a buffered signal. Continuing the example above, in certain embodiments, output port 220 is electrically coupled to a distribution circuit such that the buffered clock signal can be distributed to the necessary components. In some embodiments, the buffered clock signal is distributed to various components that generate control signals for an SRAM.

Base delay stage 216 includes an PFET stack 204 and a NFET stack 206 that are electrically coupled in opposition to input port 218 and output port 220. PFET stack 204 generally contains a plurality of PFETs serially electrically coupled, source-to-drain. The lower-most PFET of the plurality has its drain electrically coupled to output port 220. The upper-most PFET of the plurality has its source electrically coupled to upper delay path select circuit 210-A. The respective gates of the plurality of PFETs are electrically coupled to input port 218, such that an input signal controls the current flow from source to drain. Similarly, NFET stack 206 generally contains a plurality of NFETs serially electrically coupled, source-to-drain. The upper-most NFET of the plurality has its source electrically coupled to output port 220. The lower-most NFET of the plurality has its drain electrically coupled to lower delay path select circuit 212-A. The respective gates of the plurality of NFETs are electrically coupled to input port 218, such that the input signal controls the current flow from source to drain. Base delay stage 216 effectively operates as an inverter circuit and forms a base delay path from input port 218 to output port 220.

Similar to PFET stack 204, PFET stack 214-A and PFET stack 214-B each contain a plurality of PFETs serially electrically coupled, source-to-drain. The respective gates of the plurality of PFETs are electrically coupled to input port 218, such that the input signal controls current flow from source to drain. The upper-most PFET of PFET stack 214-B has a source electrically coupled to voltage source 202. The lower-most PFET of PFET stack 214-B has a drain electrically coupled to upper delay path select circuit 210-B, through which PFET stack 214-B is electrically couplable to PFET stack 214-A. The upper-most PFET of PFET stack 214-A has a source also electrically coupled to upper delay path select circuit 210-B. The lower-most PFET of PFET stack 214-A has a drain electrically coupled to upper delay path select circuit 210-A.

Upper delay path select circuit 210-B includes two parallel electrically coupled PFETs. The two PFETs are inversely controlled by a select signal B 222 and its inverse, inverted select signal B 224. As such, given a state of select signal B 222, generally only one of the two PFETs is closed. Select signal B 222 controls a bypass transistor that, when closed, causes upper delay path select circuit 210-B to bypass PFET stack 214-B and electrically couples voltage source 202 to PFET stack 214-A and upper delay path select circuit 210-A. Otherwise, when the bypass transistor is open and inverted select signal B 224 causes a delay path transistor to close, PFET stack 214-B is electrically coupled to PFET stack 214-A and upper delay path select circuit 210-A.

Similar to upper delay path select circuit 210-B, upper delay path select circuit 210-A includes two parallel electrically coupled PFETs, a bypass transistor and a delay path transistor. The two PFETs are inversely controlled by a select signal A 226 and its inverse, inverted select signal A 228. As in upper delay path select circuit 210-B, given a state of select signal A 226, generally only one of the two PFETs is closed. Select signal A 226 controls the bypass transistor, which, when closed, is configured to electrically couple upper delay path select circuit 210-B to base delay stage 216. Otherwise, when the bypass transistor is closed and inverted control signal A 228 causes the delay path transistor to close, PFET stack 214-A is electrically coupled to base delay stage 216.

The combination of upper delay path select circuit 110-A and upper delay path select circuit 210-B allows any combination of PFET stack 214-A and 214-B to be added to the base delay path formed by base delay stage 216, potentially lengthening the configurable delay path from input port 218 to output port 220. The potential combinations of PFET stack 214-A and PFET stack 214-B include: the addition of both, the bypass of both, the addition of PFET stack 214-A alone, and the addition of PFET stack 214-B alone. Together with base delay stage 216, these combinations can form up to four unique delay paths. In alternate embodiments, additional delay path select circuits and PFET stacks can be included to add dimensions to the configurable delay path. For example, a third delay path select circuit and PFET stack would provide for up to eight unique delay paths controlled by three select signals.

Similar to the upper delay path select circuits and PFET stacks, lower delay path select circuit 212-A, lower delay path select circuit 212-B, NFET stack 208-A, and NFET stack 208-B form the lower half of configurable delay circuit 200. NFET stack 208-A contains a plurality of NFETs serially electrically coupled, source-to-drain, as in NFET stack 206. The same is true for NFET stack 208-B and the plurality of NFETs contained therein. The respective gates of the pluralities of NFETs are electrically coupled to input port 218, such that the input signal controls current flow from source to drain. The lower-most NFET of NFET stack 208-B has a drain electrically coupled to ground 230. The lower-most NFET of NFET stack 208-A has a drain that is electrically couplable to the source of the upper-most NFET of NFET stack 208-B through lower delay path select circuit 212-B. The upper-most NFET of NFET stack 208-A has a source electrically coupled to lower delay path select circuit 212-A.

Lower delay path select circuit 212-B includes two NFETs, a bypass transistor and a delay path transistor. The two NFETs are inversely controlled by select signal B 222 and its inverse, inverted select signal B 224. Distinct from upper delay path select circuit 210-B, the bypass transistor of lower delay path select circuit 212-B is controlled by inverted select signal B 224. Likewise, the delay path transistor is controlled by select signal B 222. This arrangement is consistent with lower delay path select circuit 212-A, where a delay path transistor is controlled by select signal A 226 and a bypass transistor is controlled by inverted select signal A 228.

Lower delay path select circuit 212-A and lower delay path select circuit 212-B are configured to respectively mimic upper delay path select circuit 210-A and upper delay path select circuit 210-B. When PFET stack 214-A is electrically coupled to base delay stage 216, select signal A 226 causes the delay path transistor of lower delay path select circuit 212-A to electrically couple NFET stack 208-A. Similarly, when PFET stack 214-B is electrically coupled to base delay stage 216, select signal B 222 causes the delay path transistor of lower delay path select circuit 212-B to electrically couple NFET stack 208-B. Likewise, respective bypass transistors in upper delay path select circuit 210-A and lower delay path select circuit 212-A are respectively like-controlled by select signal A 226 and inverted select signal A 228. Respective bypass transistors in upper delay path select circuit 210-B and lower delay path select circuit 212-B are respectively like-controlled by select signal B 222 and inverted select signal B 224.

In this arrangement, current flow is controlled by the input signal on input port 218, directing current flow from either voltage supply 202 to output port 220 or from input port 218 to ground 230, effectively operating as an inverter. The configurable delay path formed by combinations of PFET stack 214-A, PFET stack 214-B, and PFET stack 204 are generally equivalent to the configurable delay path formed by mimicked combinations of NFET stack 208-A, NFET stack 208-B, and NFET stack 206. In some embodiments, differences in switching times between NFET and PFET devices may be apparent in the configurable delay path from input port 218 to output port 220, depending on the state of the input signal present on input port 218.

Figure 3:
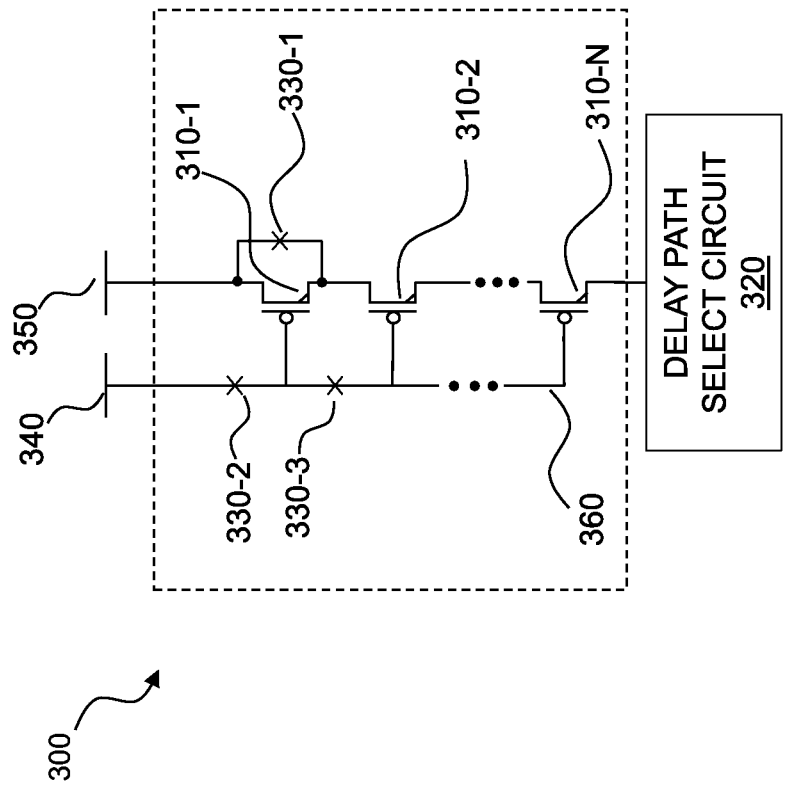
FIG. 3 is a schematic of one embodiment of a transistor stack for a configurable delay circuit.

FIG. 3 is a schematic of one embodiment of a transistor stack 300 for a configurable delay circuit, such as the embodiment of FIG. 2. Transistor stack 300 includes N PFETs, PFET 310-1, and PFET 310-2 through PFET 310-N. The PFET devices are serially electrically coupled, source-to-drain. Alternate embodiments can employ NFET devices in place of the PFETs.

In the embodiment of FIG. 3, the lower-most PFET, PFET 310-N, has a drain electrically coupled to a delay path select circuit 320. The upper-most PFET, PFET 310-1, has a source electrically coupled to a voltage source 350. Voltage source 350 is sometimes referred to as a power supply or a "rail." In certain embodiments, voltage source 350 supplies logic level voltage to transistor stack 300. In other embodiments, other voltages can be used, such as the cell voltage in SRAM.

Continuing the embodiment of FIG. 3, the respective gates of the N PFETs are electrically coupled to an input line 360. In a configurable delay circuit, input line 360 carries an input signal to be buffered. The signal on input line 360 controls current flow from voltage source 350 to delay path select circuit 320.

Transistor stack 300 also includes metal option 330-1, metal option 330-2, and metal option 330-3. The purpose of metal options is to allow circuit designers to accommodate delay differences between pre-layout simulation and post-layout simulation during final design. Circuit layout can introduce additional latencies into transistor stack 330, ultimately effecting the cumulative configurable gain of a configurable delay circuit. The metal options allow the circuit designer to make small adjustments in the delay of transistor stack 300. Metal option 330-1 allows the making of a bypass circuit around PFET 310-1. A making of metal option 330-1 effectively removes PFET 310-1 from transistor stack 300. Metal option 330-2 and metal option 330-3 complete the removal of PFET 310-1 by isolating the gate of PFET 310-1 from input line 360 and grounding the remaining traces. A breaking of metal option 330-3 isolates the gate and a making of metal option 330-2 ties the gate to a ground 340.

Figure 4:
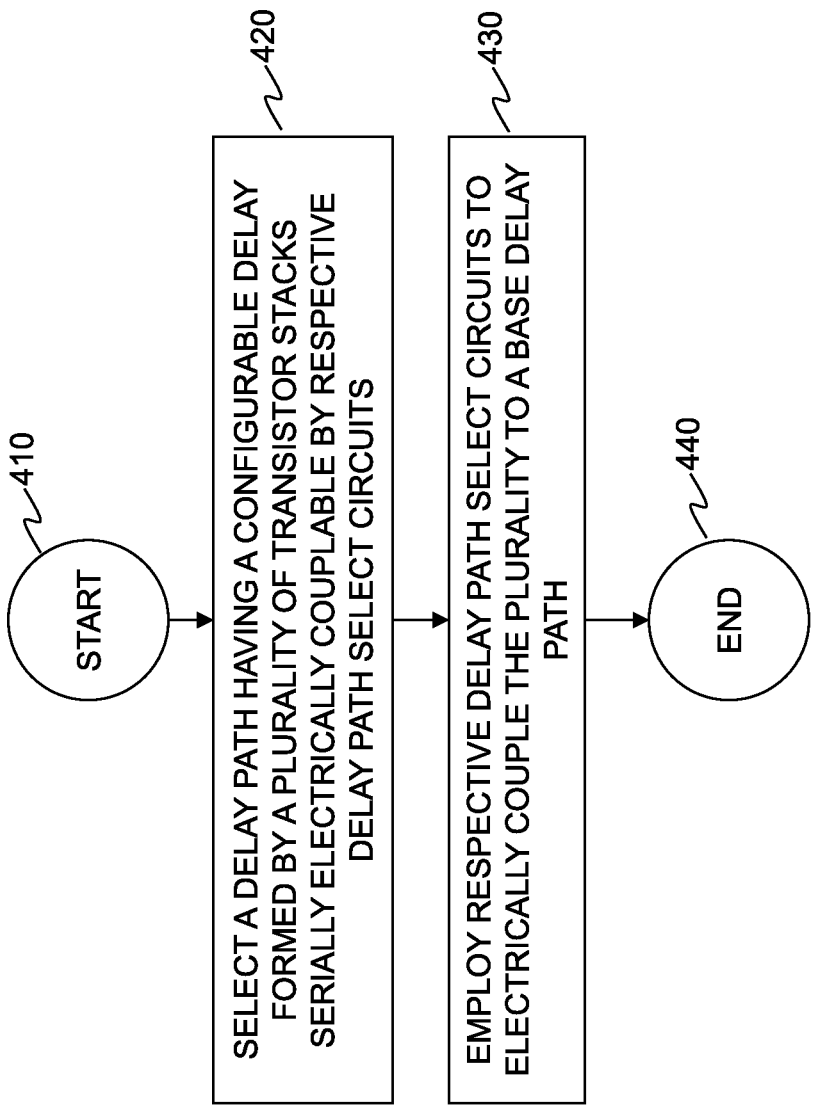
FIG. 4 is a flow diagram of one embodiment of a method of clock buffering.

FIG. 4 is a flow diagram of one embodiment of a method of clock buffering. The method begins in a start step 400. In a delay path selection step 420, a delay path is selected that has a configurable delay formed by a plurality of transistor stacks. In alternate embodiments, the method includes receiving a clock signal that needs to be buffered. Continuing the embodiment of FIG. 4, the transistor stacks are serially electrically couplable by respective delay path select circuits. In certain embodiments, the configurable delay is calculated based on the delay introduced by a base delay path and timing margins necessary among controls signals in an SRAM.

In an activation step 430, respective delay path select circuits are employed to electrically couple the plurality of transistor stacks to the base delay path, effectively lengthening the base delay path. In certain embodiments, electrically coupling a transistor stack is achieved by closing a delay path switch within the respective delay path select circuit and electrically coupled between the transistor stack and the base delay path. In certain embodiments, the switch is another transistor controlled by a select signal. The plurality of transistor stacks are optionally electrically couplable to allow for flexible combination of the plurality. When a given transistor stack is electrically coupled, its delay is added to the delay of the base delay path, yielding a configurable delay path that is cumulative of the base delay path and that introduced by the transistor stack.

In alternate embodiments, the method includes a decision step to determine if the buffered signal is to be used in a dual voltage level, or "dual rail," system. In certain embodiments, dual rail systems necessitate greater margins, and therefore longer delay paths. The decision is then used to drive select signals to control the respective delay path select circuits that electrically couple the plurality of transistor stacks. The method then ends in an end step 440.

Those skilled in the art to which this application relates will appreciate that other and further additions, deletions, substitutions and modifications may be made to the described embodiments.

What is claimed is:

1. A configurable delay circuit, comprising:
   a first delay stage electrically couplable in series to a second delay stage, said first delay stage and said second delay stage each having an input port electrically coupled to a signal source; and
   a delay path select circuit electrically coupled between said first delay stage and said second delay stage, and operable to select between a delay path including said first delay stage and another delay path including said first delay stage and said second delay stage.

2. The configurable delay circuit as recited in claim 1 wherein said signal source is a clock circuit operable to generate a periodic clock signal.

3. The configurable delay circuit as recited in claim 1 wherein said delay path select circuit is operable to select based on a select signal.

4. The configurable delay circuit as recited in claim 3 wherein said delay path select circuit includes parallel transistors inversely controlled by said select signal.

5. The configurable delay circuit as recited in claim 4 wherein said parallel transistors include respective sources respectively electrically coupled to a voltage supply and said second delay stage.

6. The configurable delay circuit as recited in claim 1 wherein said second delay stage includes a transistor stack electrically coupled between a voltage supply and said delay path select circuit.

7. The configurable delay circuit as recited in claim 6 wherein respective gates of said transistor stack are electrically coupled to said signal source.

8. A method of clock buffering, comprising:
   selecting a delay path having a configurable delay formed by a plurality of transistor stacks serially electrically couplable by respective delay path select circuits; and
   employing said respective delay path select circuits in electrically coupling said plurality to a base delay path, thereby activating said delay path and allowing a clock signal to propagate therein.

9. The method as recited in claim 8 further comprising receiving a clock signal.

10. The method as recited in claim 8 wherein said configurable delay is calculated based on said base delay path and timing margins among control signals in a static random access memory (SRAM).

11. The method as recited in claim 10 wherein said timing margins include a timing margin between a wordline signal and a pre-charge signal.

12. The method as recited in claim 11 wherein said wordline signal and said pre-charge signal are at distinct voltage levels.

13. The method as recited in claim 8 wherein said selecting includes determining if said clock signal is employed in a dual voltage level system.

14. The method as recited in claim 8 wherein said electrically coupling includes closing a delay path switch electrically coupled between a transistor stack of said plurality and said base delay path.

* * * * *